US010519563B2

(12) United States Patent
Wang et al.

(10) Patent No.: US 10,519,563 B2
(45) Date of Patent: Dec. 31, 2019

(54) DEVICE AND METHOD FOR CONTINUOUS VGF CRYSTAL GROWTH THROUGH ROTATION AFTER HORIZONTAL INJECTION SYNTHESIS

(71) Applicant: THE 13TH RESEARCH INSTITUTE OF CHINA ELECTRONICS TECHNOLOGY GROUP CORPORATION, Shijiazhuang, Hebei (CN)

(72) Inventors: Shujie Wang, Hebei (CN); Niefeng Sun, Hebei (CN); Huisheng Liu, Hebei (CN); Tongnian Sun, Hebei (CN); Yanlei Shi, Hebei (CN); Huimin Shao, Hebei (CN); Xiaolan Li, Hebei (CN); Yang Wang, Hebei (CN); Lijie Fu, Hebei (CN)

(73) Assignee: THE 13TH RESEARCH INSTITUTE OF CHINA ELECTRONICS TECHNOLOGY GROUP CORPORATION, Shijiazhuang, Hebei (CN)

(*) Notice: Subject to any disclaimer, the term of this patent is extended or adjusted under 35 U.S.C. 154(b) by 0 days.

(21) Appl. No.: 16/475,842

(22) PCT Filed: Dec. 11, 2017

(86) PCT No.: PCT/CN2017/115469
§ 371 (c)(1),
(2) Date: Jul. 3, 2019

(87) PCT Pub. No.: WO2019/109367
PCT Pub. Date: Jun. 13, 2019

(65) Prior Publication Data
US 2019/0352794 A1  Nov. 21, 2019

(30) Foreign Application Priority Data

Dec. 8, 2017 (CN) .......................... 2017 1 1295529
Dec. 8, 2017 (CN) .......................... 2017 1 1295536

(51) Int. Cl.
*C30B 11/04* (2006.01)
*C30B 11/00* (2006.01)
*C30B 29/40* (2006.01)

(52) U.S. Cl.
CPC .......... *C30B 11/001* (2013.01); *C30B 11/006* (2013.01); *C30B 29/40* (2013.01)

(58) Field of Classification Search
CPC ... C30B 11/001; C30B 11/002; C30B 11/006; C30B 11/007; C30B 11/04
See application file for complete search history.

(56) References Cited

U.S. PATENT DOCUMENTS 4,404,172 A * 9/1983 Gault .................... C30B 11/003
117/223
5,064,497 A * 11/1991 Clemans ................ C30B 11/002
117/81

(Continued)

FOREIGN PATENT DOCUMENTS

CN     105543949     *  4/2016
CN     105568363     *  5/2016

(Continued)

*Primary Examiner* — Robert M Kunemund
(74) *Attorney, Agent, or Firm* — Veros Legal Solutions LLP

(57) ABSTRACT

The invention provides a device and method for continuous VGF crystal growth through rotation after horizontal injection synthesis, and belongs to the technical field of semiconductor crystal synthesis and growth. According to the used technical scheme, the device comprises a furnace body, a synthesis and crystal growth system positioned in a furnace cavity, and a heating system, a temperature measuring system, a heat preservation system and a control system matched therewith, wherein the synthesis and crystal growth system comprises a crucible and a volatile element carrier arranged on a horizontal side of the crucible, and the volatile element carrier is communicated with the crucible through (Continued)

an injection pipe to realize horizontal injection synthesis; the furnace body has a rotational freedom degree by means of a matched rotating mechanism, so that after the direct horizontal injection synthesis of a volatile element and a pure metal element, the entire furnace body is controlled by the rotating mechanism to slowly rotate, such that a high-purity compound semiconductor crystal is prepared through continuous VGF crystal growth after crystal synthesis, and the condition that a seed crystal is molten by the pure metal before VGF crystal growth can be avoided; and the method has characteristics of simple steps, easy operation and control, and is suitable for the industrial production of semiconductor crystals.

13 Claims, 6 Drawing Sheets

(56) References Cited

U.S. PATENT DOCUMENTS

| | | | |
|---|---|---|---|
| 2003/0172870 A1* | 9/2003 | Liu | C30B 11/003 117/200 |
| 2016/0090663 A1 | 3/2016 | Buzniak et al. | |
| 2016/0194785 A1 | 7/2016 | Stoddard et al. | |

FOREIGN PATENT DOCUMENTS

| | | |
|---|---|---|
| CN | 105568363 A | 5/2016 |
| CN | 105803515 A | 7/2016 |
| CN | 106637383 A | 5/2017 |
| CN | 206396351 U | 8/2017 |
| CN | 207596994 U | 7/2018 |

\* cited by examiner

DEVICE AND METHOD FOR CONTINUOUS VGF CRYSTAL GROWTH THROUGH ROTATION AFTER HORIZONTAL INJECTION SYNTHESIS

CROSS-REFERENCE TO RELATED APPLICATIONS

This application claims priority to PCT Application No. PCT/CN2017/115469, filed on Dec. 11, 2017, which claims priority to Chinese Patent Application Nos. 201711295536.0 and 201711295529.0, both filed on Dec. 8, 2017, and each application is hereby incorporated by reference in its entirety.

TECHNICAL FIELD

The invention relates to a device and method for semiconductor crystal synthesis and growth, in particular to a device and method for continuous VGF crystal growth through rotation after horizontal injection synthesis, which are especially suitable for synthesizing semiconductor crystal materials synthesized from indium phosphide, gallium phosphide and the like containing volatile elements and VGF crystal growth.

BACKGROUND ART

Compound semiconductors are widely used in the electronic industry and are important compound semiconductor materials, such as InP, GaP, and GaAs. Due to the presence of volatile elements, the synthesis of these compounds is very difficult. Commonly used synthesis methods include horizontal diffusion synthesis and injection synthesis. Crystal growth methods include liquid encapsulated czochralski (LEC) method and vertical gradient freezing (VGF) method. Since the LEC method requires high equipment cost, large crystal stress, high dislocation density, complex crystal growth process, and is not conducive to the growth of high-quality large-size single crystals, the VGF method is widely used currently.

Bell Labs first used the VGF method to prepare III-V compounds in the 1980s. This method is a crystal growth method in which a container filled with indium phosphide polycrystalline raw materials is vertically placed at a corresponding temperature gradient position set in a furnace, red phosphorus is distributed around the container, and after the polycrystalline raw materials are completely molten, crystallization slowly starts from one end at a lower part all the way to one end at an upper part. The VGF method has a slow growth speed and a small temperature gradient, so crystals are less stressed, as a result, crystal materials with relatively low dislocation density can be grown. However, in this method, a seed crystal needs to be placed in a crucible before crystal growth. It is difficult to realize continuous VGF crystal growth after synthesis, because it requires direct contact between the seed crystal and pure metal. In a high-temperature pure metal melt, the compound seed crystal will be molten or eroded by the pure metal or the melt being synthesized. In order to protect the seed crystal, it is necessary to put polycrystalline raw materials into the crucible in advance and protect the seed crystal from being molten in a synthesis process through complicated temperature control procedures. However, this will lead to a reduction in the purity of a synthesized crystal material, and make the growth process of synthesized crystals time-consuming, complicated and error-prone, and make industrialization and large-scale growth difficult, which seriously hinder the application and development of semiconductor crystal materials.

SUMMARY OF THE INVENTION

In order to solve the technical problems that in the prior art, polycrystalline raw materials need to be added before synthesis during VGF crystal growth after injection synthesis, the growth process is complicated, and industrialization is difficult, the invention provides a device and method for continuous VGF crystal growth through rotation after horizontal injection synthesis. A volatile element carrying container and a crystal growth crucible are horizontally arranged. After horizontal injection synthesis of a volatile element and a pure metal element, the entire furnace body is controlled by a rotating mechanism to slowly rotate, such that a high-purity compound semiconductor crystal is prepared through continuous vertical gradient freezing (VGF) crystal growth after crystal synthesis by the combination of horizontal injection synthesis and VGF crystal growth, and the condition that a seed crystal is molten by pure metal before VGF growth can be avoided; and the method is characterized in simple steps, and the device is simple in structure and easy to operate and control, thus being conductive to industrial production of semiconductor crystals.

The technical scheme adopted by the invention is as follows:

First, the invention provides a device for continuous VGF crystal growth through rotation after horizontal injection synthesis, comprising a furnace body, a synthesis and crystal growth system positioned in a furnace cavity, and a heating system, a temperature measuring system, a heat preservation system and a control system matched therewith, and characterized in that the synthesis and crystal growth system comprises a crucible with a seed crystal containing cavity on a side, and a volatile element carrier arranged on a horizontal side thereof, the volatile element carrier is communicated with the crucible through an injection pipe to realize horizontal injection synthesis, and the furnace body has a rotational freedom degree by means of a matched rotating mechanism, thus realizing vertical temperature gradient crystal growth through rotation after horizontal injection synthesis.

Preferably, a tail end of the injection pipe faces away from or inclines away from the volatile element carrier.

Preferably, the injection pipe is of a multi-section type, and an end section thereof inclines away from the volatile element carrier and forms an included angle of 60°-85° with the volatile element carrier.

Preferably, the synthesis and crystal growth system further comprises a loading frame for loading the crucible and the volatile element carrier, the loading frame is matched with a sealing cover, the sealing cover is provided with an exhaust port, and the loading frame is made of quartz, silicon carbide, boron nitride or ceramic materials.

Preferably, the heating system structurally comprises a multi-stage heater sleeved on a periphery of the synthesis and crystal growth system; the heat preservation system structurally comprises a heat preservation sleeve sleeved outside the heating system; and the temperature measuring system structurally comprises thermocouples a, c and/or d and/or e and b which are respectively used for measuring the temperatures of a seed crystal containing cavity region, a synthesis and crystal growth part region and a volatile element carrier region in the crucible.

Preferably, the rotating mechanism comprises a driving motor and a reducer connected with an output shaft of the driving motor, an output shaft of the reducer is connected with a furnace body rotating shaft through a coupling, and the furnace body is limited on a bracket through the furnace body rotating shaft.

Further, the invention provides a method for continuous VGF crystal growth through rotation after horizontal injection synthesis, based on a device for continuous VGF crystal growth through rotation after injection synthesis comprising a furnace body, a crystal synthesis and growth system positioned in a furnace cavity, and a heating system, a temperature measuring system, a heat preservation system and a control system matched therewith, and characterized in that the crystal synthesis and growth system comprises a crucible with a seed crystal containing cavity on a side, and a volatile element carrier arranged on a horizontal side of the crucible and communicated with the crucible through an injection pipe, and the furnace body is matched with a rotating mechanism; and the method comprising the following steps:

(I) material preparation and device assembly: loading a volatile element into the volatile element carrier and sealing the volatile element carrier, placing a seed crystal, a metal element and boron oxide in the crucible, and positioning the volatile element carrier and the crucible in the furnace cavity together, wherein a liquid surface of a compound melt formed by the metal element and the volatile element is controlled to be lower than the seed crystal containing cavity, and the compound melt is sealed after the boron oxide is molten with the liquid level higher than the seed crystal containing cavity;

(II) sealing the furnace body and introducing protective gas after vacuumizing;

(III) heating to melt the metal element and the boron oxide;

(IV) heating to enable the volatile element to enter a metal element melt through the injection pipe, and injecting a synthetic compound melt; and (V) after synthesis, rotating the furnace body to a vertical state by means of the rotating mechanism, and adjusting the temperature distribution in a region where the crucible is located, thus realizing continuous VGF crystal growth after synthesis.

Preferably, in step (I), the volatile element carrier and the crucible are positioned in the furnace cavity together by firstly extending the injection pipe of the volatile element carrier into the crucible, then placing into a sealed bin provided with an exhaust port together, and then positioning the sealed bin in the furnace cavity.

Preferably, a temperature required to melt the metal element and the boron oxide by heating in step (III) is: making a temperature of the metal element higher than a melting point of the compound by 30-70° C., and a temperature of a seed crystal containing chamber region lower than the melting point of the compound by 5-15° C.; when the volatile element enters the metal element melt through the injection pipe by heating in step (IV), a condition for heating the volatile element to reach a temperature is to ensure that a pressure in the volatile element carrier is higher than a dissociation pressure of the compound melt; after synthesis in step (V), the compound melt is firstly cooled to be 5-20° C. higher than the melting point of the compound, an interface temperature between the liquid surface of the compound melt and one side of the seed crystal containing cavity of the crucible is controlled to be 3-5° C. higher than a crystallizing point of the compound, and the temperature of the seed crystal containing cavity region is kept stable; and after the furnace body is rotated to the vertical state in step (V), the compound melt is allowed to stand for 10-30 min.

Preferably, a rotation rate in step (V) is controlled to be 20-40°/h; the temperature of the seed crystal containing cavity region is kept stable during rotation; after rotating to the vertical state, the temperature distribution in a region where the crucible is located is adjusted, and a temperature gradient is established in an interface where the seed crystal makes contact with the compound melt and the compound melt by coordinated control of the temperature measuring system and the control system, so that continuous VGF crystal growth after injection synthesis is realized; and in the device for VGF crystal growth through rotation after injection synthesis, the rotating mechanism structurally comprises a driving motor and a reducer connected with an output shaft of the driving motor, an output shaft of the reducer is connected with a furnace body rotating shaft through a coupling, and the furnace body is limited on a bracket through the furnace body rotating shaft.

Preferably, in the device for continuous VGF crystal growth through rotation after injection synthesis, a tail end of the injection pipe faces away from or inclines away from the volatile element carrier and forms an included angle of 60°-85° with the volatile element carrier.

Preferably, in the device for continuous VGF crystal growth through rotation after injection synthesis, the heating system structurally comprises a multi-stage heater sleeved on a periphery of the crystal synthesis and growth system; the heat preservation system structurally comprises a heat preservation sleeve sleeved outside the heating system; and the temperature measuring system structurally comprises thermocouples a, c and/or d and/or e and b which are respectively used for measuring the temperatures of a seed crystal containing cavity region, a synthesis and crystal growth part region and a volatile element carrier region in the crucible.

In the above technical scheme, firstly, a device for vertical temperature gradient crystal growth through rotation after compound crystal synthesis is provided, which comprises a furnace body, wherein a synthesis and crystal growth system and a heating system, a temperature measuring system, a heat preservation system and a control system which are matched with the synthesis and crystal growth system are positioned in a furnace cavity of the furnace body, and the key point is that the furnace body is matched with a rotating mechanism for the rotation of the furnace body and has a rotational freedom degree; the synthesis and crystal growth system comprises a crucible and a volatile element carrier, one side of the crucible is provided with a seed crystal containing cavity, and the crucible and the volatile element carrier are horizontally arranged in parallel, wherein the crucible is like a horizontally placed funnel when horizontally arranged and structurally comprises the horizontal strip-shaped seed crystal containing cavity, a synthesis and crystal growing part connected with the seed crystal containing cavity and an injection insertion hole; and the volatile element carrier is provided with an injection pipe which extends into the crucible through the injection insertion hole. When the device is used, a volatile element is placed in the volatile element carrier and the volatile element carrier is sealed. A seed crystal is put into the seed crystal containing cavity of the crucible, and pure metal and the boron oxide are put in the crucible, wherein the amount of each substance needs to be controlled such that the amount of a pure metal element enables a metal element melt formed after heating and melting to have a height below the seed crystal containing cavity and be not in contact with the seed crystal; and the boron oxide is higher than the seed crystal containing cavity after being heated and molten, thus covering the seed crystal; the volatile element enters the metal element melt through the injection pipe after being heated, so that horizontal injection synthesis is realized, and a compound melt is formed; and the compound melt should have a proper amount so as not to make contact with the seed crystal. More importantly, after horizontal injection synthesis, the rotating mechanism is started to control the furnace body to rotate by 90°, and the temperature distribution of each heated region is adjusted in the rotating process of the furnace body to ensure that a temperature of a seed crystal end is lower than a melting point of the seed crystal; the furnace body rotates to be vertical from a horizontal state, at this point, the volatile element carrier is positioned on the top, the crucible is positioned below, and the compound melt is in contact with the seed crystal; and after the furnace body becomes vertical, the temperature distribution of each heated region is adjusted again to ensure the vertical gradient crystal growth in the crystal growth crucible.

Further, a method for continuous VGF crystal growth through rotation after horizontal injection synthesis is provided based on the device for continuous VGF crystal growth through rotation after injection synthesis, the device structurally comprises a furnace body, a crystal synthesis and growth system is positioned in a furnace cavity of the furnace body, and a heating system, a temperature measuring system, a heat preservation system and a control system are arranged in the crystal synthesis and growth system in a matched mode, and the key point is that the furnace body is matched with a rotating mechanism for the rotation of the furnace body and has a rotational freedom degree; the synthesis and crystal growth system comprises a crucible and a volatile element carrier, one side of the crucible is provided with a seed crystal containing cavity, and the crucible and the volatile element carrier are horizontally arranged in parallel, wherein the crucible is like a horizontally placed funnel when horizontally arranged and structurally comprises the horizontal strip-shaped seed crystal containing cavity, a synthesis and crystal growing part connected with the seed crystal containing cavity and an injection insertion hole; and the volatile element carrier is provided with an injection pipe which extends into the crucible through the injection insertion hole.

Based on the device, the method for continuous VGF crystal growth through rotation after horizontal injection synthesis comprises:

(I) material preparation and device assembly: loading a volatile element into the volatile element carrier and sealing the volatile element carrier, placing a seed crystal, a metal element and a protective agent such as boron oxide in the crucible, inserting the injection pipe of the volatile element carrier in the crucible, and positioning the volatile element carrier and the crucible in the furnace cavity together; wherein the amount of each substance is controlled as follows during material preparation: the amount of the metal element enables the height after heating and melting to be below the seed crystal containing cavity so as to avoid contact with the seed crystal; the protective agent boron oxide is higher than the seed crystal containing cavity after being heated and molten, thus covering the seed crystal; the volatile element enters a metal element melt through the injection pipe after being heated, so that a compound melt is formed through injection synthesis; a liquid surface of the compound melt is lower than the seed crystal containing cavity and is prevented from making contact with the seed crystal; the compound melt is formed by the heated and molten metal element melt and the volatile element after volatilization, the protective agent such as boron oxide can seal the compound melt after being molten, and a liquid surface thereof is higher than the seed crystal containing cavity;

(II) sealing the furnace body, vacuumizing the furnace body, generally to $10^{-3}$ Pa, and then introducing protective gas which can be inert gas such as nitrogen and argon, wherein it is generally necessary to control a pressure of the protective gas during synthesis and crystal growth to be greater than a dissociation pressure of the compound melt;

(III) heating to melt the metal element and the boron oxide, wherein in this step, a heating temperature range is generally controlled to ensure that a temperature of the metal element reaches 30-70° C. above a melting point of the compound, at the same time, a temperature of a seed crystal containing cavity region is lower than the melting point of the compound by 5-15° C., and the boron oxide seals the metal element melt and the seed crystal after melting;

(IV) heating to enable the volatile element to enter a metal element melt through the injection pipe, and horizontally injecting a synthetic compound melt, wherein during heating, a temperature of a region where the volatile element is located should be accurately detected and controlled in time so as to control an injection rate of the volatile element; and (V) after synthesis, rotating the furnace body to a vertical state by means of the rotating mechanism, adjusting the temperature distribution in a region where the crucible is located, and establishing a temperature gradient in an interface where the seed crystal makes contact with the compound melt and the compound melt, so that continuous VGF crystal growth after injection synthesis is realized.

The invention has the beneficial effects that according to the device for continuous VGF crystal growth through rotation after horizontal injection synthesis provided by the invention, by skillfully disposing the rotating mechanism, scientifically arranging the positional structures of the volatile element carrying container and the crucible in the furnace body, and controlling the position change of the volatile element carrying container and the crucible, smart combination of horizontal injection synthesis and vertical gradient crystal growth is realized, and continuous vertical gradient crystal growth is realized through rotation after horizontal injection synthesis; according to the method for continuous VGF crystal growth through rotation after horizontal injection synthesis and the matched device provided by the invention, the process is simplified, and the condition that the seed crystal is molten by the pure metal before VGF growth is avoided; and the method has simple steps and is easy to operate and control, the device is simple in structure and easy to operate, and a synthesized semiconductor crystal is controllable in shape and uniform in quality, so the invention is favorable for realizing industrialized production of semiconductor crystals.

wherein 1. thermocouple c; 2. insulating board; 3. multi-stage heater; 4. thermocouple b; 5. loading bin; 5-1. sealing cover; 5-1-1. exhaust port; 6. volatile element carrier; 7. volatile element; 8. injection pipe; 9. crucible; 9-1. seed crystal containing cavity; 9-2. synthesis and crystal growth part; 9-3. injection insertion hole; 10. metal element; 11. boron oxide; 12. thermocouple e; 13. thermocouple d; 14. thermocouple a; 15. seed crystal; 16. crucible support; 17. furnace body; 17-1. furnace body rotating shaft; 17-2. bracket; 18. heat preservation sleeve.

DETAILED DESCRIPTION OF THE INVENTION

Hereinafter, a device and method for continuous VGF crystal growth through rotation after horizontal injection synthesis provided by the present invention will be described in detail through specific embodiments to facilitate understanding, but not to limit the present invention in any form. Improvement and modification or similar substitution made by those skilled in the art according to the technical scheme shall be included in the scope of protection of the present invention.

Device Embodiment 1

Figure 1:
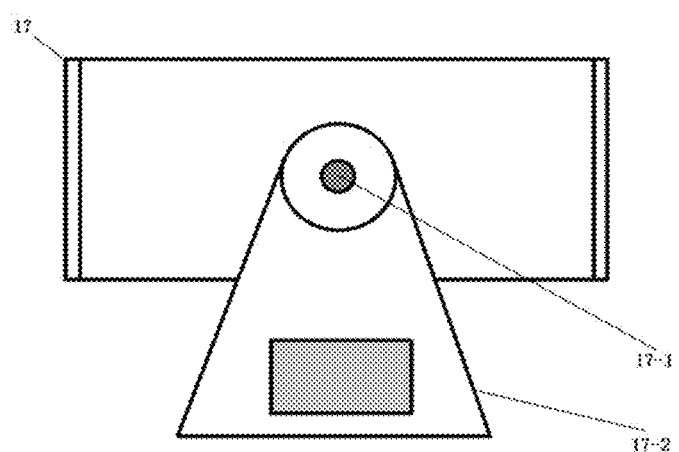
FIG. 1 is a schematic view of an overall structure of a furnace body of the device on a bracket.

The embodiment provides a device for vertical temperature gradient crystal growth through rotation after compound crystal synthesis. Referring to FIG. 1, the device structurally comprises a furnace body 17, and a synthesis and crystal growth system and a heating system, a temperature measuring system, a heat preservation system and a control system matched therewith positioned in the furnace body 17, the furnace body 17 is provided with a sealing cover to form a sealed cavity, the synthesis and crystal growth system is arranged in the furnace body 17, and the heating system is sleeved on a periphery of the crystal synthesis and growth system to accurately heat various parts of the synthesis and crystal growth system. This embodiment adopts a multi-stage heater 3, and the heat preservation system is arranged on an outer layer of the heating system, and is a heat preservation sleeve 18 in this embodiment to be used for integrally preserving the heat of the synthesis and crystal growth system. The temperature measuring system may be a plurality of thermocouples, which are dispersed or inserted in the synthesis and crystal growth system, the heating system or the heat preservation system for measuring a temperature of a corresponding region in real time. In this embodiment, the temperature measuring system structurally comprises a thermocouple a 14 for measuring a temperature of a seed crystal containing cavity 9-1 region in the crystal growth crucible 9, thermocouples c 1, d 13 and e 12 for measuring a temperature of a synthesis and crystal growth part 9-2 region, and a thermocouples b 4 for measuring a temperature of a volatile element carrier 6 region. The control system is used for receiving and sending signals, and comprehensively controlling and coordinating the heating system, the temperature measuring system and the like, and specifically, may be a PLC.

As a key design of this embodiment, the furnace body 17 is matched with a rotating mechanism, so that the rotation of the furnace body 17 can be realized. A positioning and connecting relationship between the furnace body 17 and the rotating mechanism, and the rotating mechanism can be referred to conventional rotation. In this embodiment, referring to FIG. 1, the furnace body 17 is limited on a bracket 17-2 through a furnace body rotating shaft 17-1, the rotating mechanism comprises a driving motor and a reducer connected with an output shaft of the driving motor, and an output shaft of the reducer is connected with the furnace body rotating shaft 17-1 through a coupling, so as to control the rotation of the furnace body 17.

Figure 2:
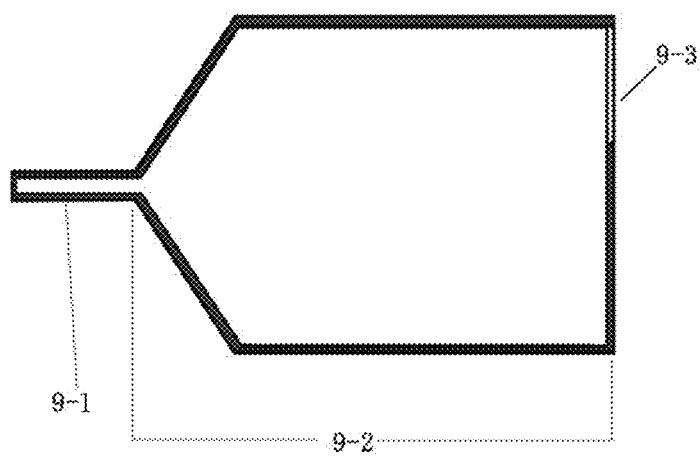
FIG. 2 is a schematic view of a structure of a crucible when the device is placed horizontally.

The synthesis and crystal growth system comprises a crucible 9 and a volatile element carrier 6 arranged on a horizontal side of the crucible 9, wherein the crucible 9 is like a horizontally placed funnel when horizontally arranged (referring to FIG. 2 for the shape), and structurally comprises a horizontal cuboid-shaped or cylindrical seed crystal containing cavity 9-1 arranged on a side, a synthesis and crystal growing part 9-2 connected with the seed crystal containing cavity 9-1 and an injection insertion hole 9-3; the injection insertion hole 9-3 is located at an upper portion or end of the synthesis and crystal growth portion 9-2, and a diameter thereof should be such that a height of a compound melt is lower than a lower edge of the injection insertion hole 9-3 after synthesis, so that the compound melt does not flow out of the crucible 9 from the injection insertion hole 9-3; the volatile element carrier 6 is provided with an injection pipe 8, the injection pipe 8 extends into the crucible 9 through the injection insertion hole 9-3, and a volatile element 7 in the volatile element carrier 6 is heated to enter the crucible 9 through the injection pipe 8 to realize horizontal injection synthesis with a metal melt in the crucible 9; and after synthesis, the furnace body 17 is rotated to be vertical from a horizontal state by means of the rotating mechanism, the temperature distribution of each heated region is adjusted to ensure that a temperature in the seed crystal containing cavity 9-1 is lower than a melting point of a seed crystal 15, and after the furnace body 17 becomes vertical, the temperature distribution of each heated region is adjusted again to ensure that the compound melt in the crucible 9 makes contact with the seed crystal 15 to realize vertical gradient crystal growth.

Figure 3:
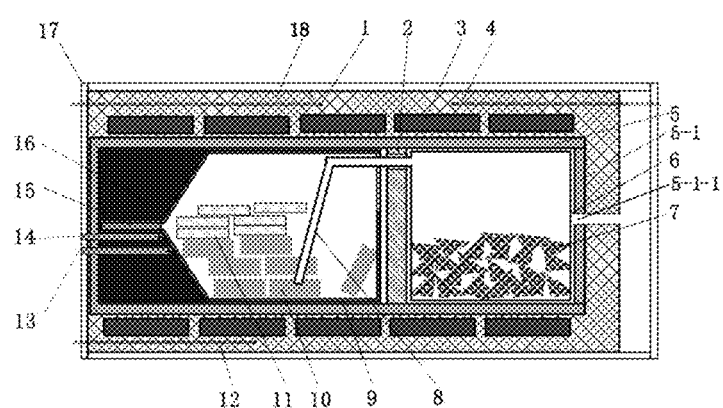
FIG. 3 is a schematic view of a crystal synthesis and growth system in a material preparation stage when the device is placed horizontally.

In order to prevent the compound melt in the crucible 9 from flowing backward to the volatile element carrier 6 due to the rotation of the furnace body 17, the injection pipe 8 is arranged in a multi-section type, in a bent mode as shown in FIG. 3, and an end section inclines away from the volatile element carrier 6, preferably, the end section deviates from the volatile element carrier 6 and forms an included angle of 60°-85° with a side edge line of the volatile element carrier.

In order to further ensure the stability of the synthesis and crystal growth system, the synthesis and crystal growth system further comprises a loading frame 5 for loading the crucible 9 and the volatile element carrier 6. Referring to FIGS. 3 to 6, the loading frame 5 can be made of quartz, silicon carbide, boron nitride or ceramic materials, the loading frame 5 is matched with a sealing cover 5-1, and the sealing cover 5-1 is provided with an exhaust port 5-1-1. During device assembly, the injection pipe 8 of the volatile element carrier 6 is inserted into the injection insertion hole 9-3 of the crucible 9, an insulating board 2 is arranged between the volatile element carrier 6 and the crucible 9, then the volatile element carrier 6 and the crucible 9 are put into the loading frame 5 together, and then the sealing cover 5-1 is installed, so that the sealing cover 5-1 is fixedly and hermetically connected with the loading frame 5; and the exhaust port 5-1-1 is used for balancing an air pressure in the loading frame 5 during synthesis, so that excess gas generated by pressure increase in the loading frame 5 can be discharged in the process of forming the compound melt after the volatile element is injected into the metal melt.

The crucible 9 and the volatile element carrier 6 are separated by the insulating board 2; on the one hand, the insulating board 2 is arranged to separate the crucible 9 and the volatile element carrier 6 so as to avoid mutual influence of temperatures; and on the other hand, when the furnace body 17 is rotated to be in a vertical state, the insulating board 2 is supported on an upper end surface of the crucible 9 to prevent the volatile element carrier 6 from accidentally falling into the crucible 9.

The crucible 9 is matched with a crucible support 16, which has supporting and protecting effects on the seed crystal containing cavity 9-1 and the crucible 9 as a whole.

Device Embodiment 2

Different from embodiment 1, the injection pipe 8 in this embodiment is a Z-shaped multi-section pipe, and a tail end thereof faces away from the volatile element carrier 6.

The loading frame 5 is made of quartz.

The device described in embodiment 1 is taken as an example to illustrate a method for continuous VGF crystal growth through rotation after horizontal injection synthesis.

Synthesis Method Embodiment 1—Synthesis of Indium Phosphide Semiconductor Material (I) Material preparation and device assembly: as shown in FIG. 3, loading a volatile element 7 (red phosphorus in this embodiment) into the volatile element carrier 6 and sealing the volatile element carrier 6, placing a seed crystal 15 of indium phosphide, a metal element 10 (pure indium metal in this embodiment), a dopant (high purity sulfur or high purity iron) and boron oxide 11 in the crucible 9, then inserting the injection pipe 8 of the volatile element carrier 6 into the injection insertion hole 9-3 of the crucible 9, separating the volatile element carrier 6 from the synthesis and crystal growth crucible 9 with the insulating board 2, then putting the volatile element carrier 6, the crucible 9 and the insulating board 2 therebetween into a sealed bin together, and putting the sealed bin into the furnace cavity as a whole, wherein the sealed bin in this embodiment is a loading bin 5, the loading bin 5 is matched with a sealing cover 5-1 so as to form the sealed bin, and sealed connection is realized through welding or sleeve sealing, etc; and the amount of loaded pure indium metal is to ensure that indium does not make contact with the seed crystal 15 after being molten, that the boron oxide 11 covers the seed crystal 15 after being molten, and that an indium-phosphorus melt formed after synthesis does not make contact with the seed crystal 15.

(II) Sealing the furnace body, vacuumizing to $10^{-3}$ Pa, and introducing protective gas nitrogen 1.5-1.8 MPa to ensure that a pressure of the protective gas is 3.0-4.0 MPa during synthesis and crystal growth (2.75 MPa higher than a dissociation pressure of indium phosphide near a melting point).

(III) Controlling the multi-stage heater 3 to heat a region where the crucible 9 is located, wherein a temperature of the metal element 10 is made higher than a melting point of the compound by 30-70° C. since injection synthesis efficiency will be affected if the temperature is too low, and a pressure required to synthesize the proportioned melt is too high when the temperature is too high; through the control system and the thermocouples e and/or c and/or d, the temperature of the metal element 10 (pure indium) in the crucible 9 is guaranteed to reach 1112° C. (the melting point of the compound indium phosphide is 1062° C.), and at the same time, a temperature in the seed crystal containing cavity 9-1 region is lower than the melting point of the compound by 5-15° C.; in this embodiment, through the cooperation of the thermocouple e, the control system and the heating system, a temperature of the thermocouple e is controlled at 1050° C.; and the boron oxide 11 is heated to become a melt, and the pure indium melt and the seed crystal 15 are sealed.

Figure 4:
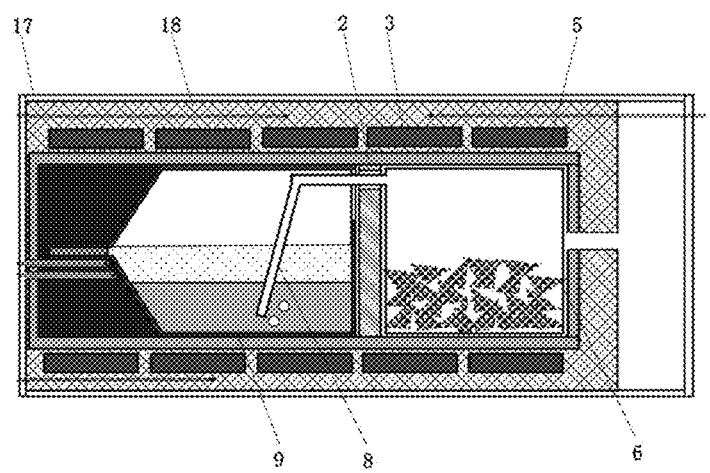
FIG. 4 is a schematic view of a crystal synthesis and growth system in a synthesis stage when the device is placed horizontally.
Figure 5:
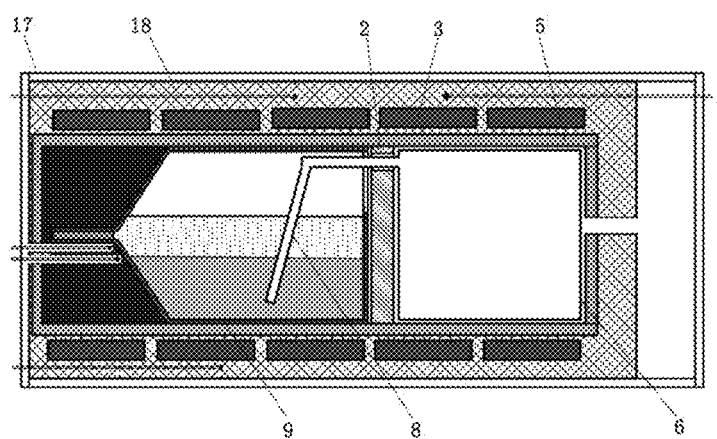
FIG. 5 is a schematic view of a crystal synthesis and growth system after synthesis when the device is placed horizontally.

(IV) Controlling the multi-stage heater 3 to heat a region where the volatile element carrier 6 is located, wherein a temperature of a region where the thermocouple b is located is controlled to be about 800° C., at this point, a dissociation pressure of red phosphorus is higher than an atmosphere pressure (3.0-4.0 MPa), red phosphorus is volatilized under heating, and phosphorus gas is injected into the metal element 7 melt (pure indium melt), as shown in FIG. 4; as the volatile element 7 overflows after injection, a pressure in the quartz loading bin 5 will increase, and excess gas will be discharged through the exhaust port 5-1-1 on the loading bin 5; and as synthesis progresses, a volume of the compound melt increases continuously, and the seed crystal 15 will not make contact with the compound melt at this point, as shown in FIG. 5.

Figure 6:
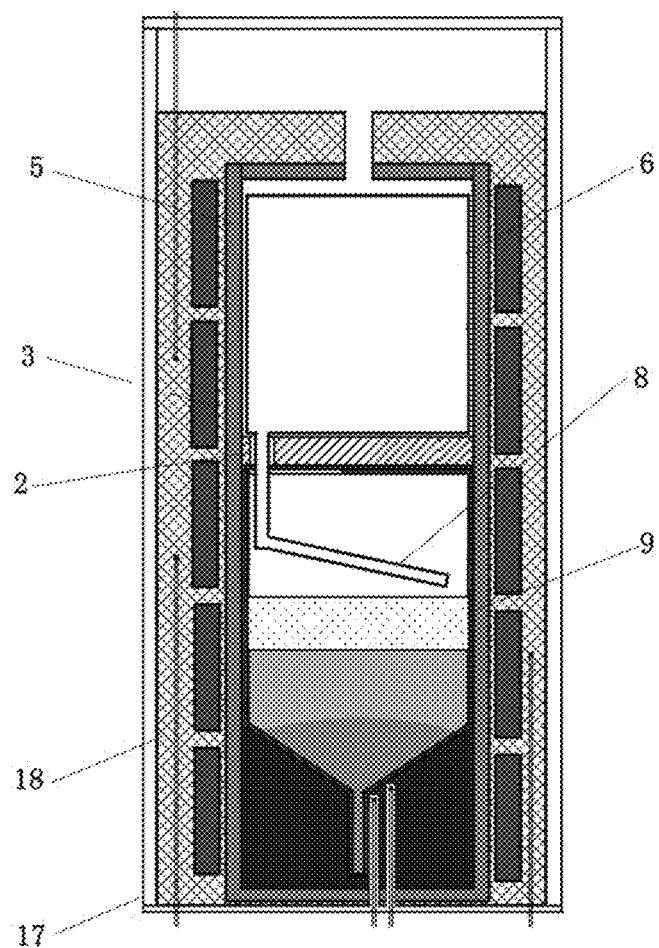
FIG. 6 is a schematic view of a crystal synthesis and growth system in a VGF crystal growth stage after the device is rotated to be vertical.

(V) After synthesis, cooling a region where the compound melt is located till a temperature of the thermocouples a and/or c and/or d is 10° C. above 1062° C., controlling the temperatures of the thermocouple b and the thermocouple d to be thermocouple b≥thermocouple d>1062° C., and guaranteeing that a temperature of the thermocouple e in the seed crystal containing cavity 9-1 region is unchanged; then slowly rotating the whole furnace body 17 to a vertical state at a speed of 30°/h, and allowing the melt to stand for 10-30 min so that the boron oxide and the melt in the injection pipe 8 drop into the synthesis and crystal growth part 9-2, during which a temperature of the thermocouple e is kept constant; controlling the multi-stage heater 3 to establish a temperature gradient in an interface where the seed crystal 15 makes contact with the compound melt and the compound melt, and controlling a relationship between the temperatures of the thermocouples to be thermocouple b>thermocouple c>thermocouple e>thermocouple d>thermocouple a, during which the temperature gradient of the solid-liquid interface is ensured to be about 5 k/mm; and then conducting VGF crystal growth, as shown in FIG. 6, so as to obtain an indium phosphide semiconductor single crystal material.

Carrier concentration of prepared sulfur-doped indium phosphide crystals: $\geq 1 \times 10^{18}$ cm$^{-3}$; mobility: $\geq 1000$ cm$^2$ V$^{-1}$ S$^{-1}$; resistivity: $(0.1-6) \times 10^{-3}$ Ω·cm; dislocation density <1000/cm$^2$.

Mobility of prepared iron-doped indium phosphide crystals: $\geq 1000$ cm$^2$ V$^{-1}$ S$^{-1}$; resistivity: $1 \times 10^7$ Ω·cm; dislocation density <5000/cm$^2$.

Synthesis Method Embodiment 2—Synthesis of Gallium Phosphide Semiconductor Material (I) Material preparation and device assembly: as shown in FIG. 3, loading a volatile element 7 (red phosphorus) into the volatile element carrier 6 and sealing the volatile element carrier 6, placing a seed crystal 15 of gallium phosphide, a metal element 10 (pure gallium metal), a dopant (high purity sulfur or high purity zinc) and boron oxide 11 in the crucible 9, then inserting the injection pipe 8 of the volatile element carrier 6 into the injection insertion hole 9-3 of the synthesis and crystal growth crucible 9, separating the volatile element carrier 6 from the crucible 9 with the insulating board 2, then putting the volatile element carrier 6, the crucible 9 and the insulating board 2 into the loading bin 5, assembling the sealing cover 5-1 and the loading bin 5, and putting into the furnace cavity as a whole, wherein the amount of loaded pure gallium metal is to ensure that gallium does not make contact with the seed crystal 15 after being molten, that the boron oxide 11 covers the seed crystal 15 after being molten, and that a gallium-phosphorus melt formed after synthesis does not make contact with the seed crystal 15.

(II) Sealing the furnace body, vacuumizing to $10^{-3}$ Pa, and introducing protective gas 3 MPa to ensure that a pressure of the protective gas is 5.0 MPa during synthesis and crystal growth.

(III) Controlling the multi-stage heater 3 to heat a region where the crucible 9 is located, wherein through the control system and the thermocouples a and/or c and/or d, the temperature of the metal element 7 (pure gallium) in the crucible 9 is guaranteed to reach 1526° C. (a melting point of the compound gallium phosphide is 1476° C., 50° C. higher), and a temperature of the seed crystal containing chamber 9-1 region (thermocouple e) is ensured to be lower than the melting point of the compound, which is controlled at about 1465° C.; and the boron oxide 11 is heated to become a melt, and the pure gallium melt and the seed crystal 15 are sealed.

(IV) Controlling the multi-stage heater 3 to heat a region where the volatile element carrier 6 is located, wherein a temperature of a region where the thermocouple b is located is controlled to be about 900° C., at this point, a dissociation pressure of red phosphorus is higher than an atmosphere pressure (5.0 MPa), red phosphorus is volatilized under heating, and phosphorus gas is injected into the metal element 7 melt (pure gallium melt), as shown in FIG. 4; as the volatile element 7 overflows after injection, a pressure in the quartz loading bin 5 will increase, and excess gas will be discharged through the exhaust port 5-1-1 on the loading bin 5; and as synthesis progresses, a volume of the compound melt increases continuously, and the seed crystal 15 will not make contact with the compound melt at this point, as shown in FIG. 5.

(V) After synthesis, cooling a region where the compound melt is located till a temperature of the thermocouples a and/or c and/or d is 10° C. above 1476° C., controlling the temperatures of the thermocouple b and the thermocouple d to be thermocouple b≥thermocouple d>1476° C., and guaranteeing that a temperature of the thermocouple e in the seed crystal containing cavity 9-1 region is unchanged; then slowly rotating the whole furnace body 17 to a vertical state at a speed of 35°/h, and allowing the melt to stand for 20 min so that the boron oxide in the injection pipe 8 drop into the compound melt, during which a temperature of the thermocouple e is kept constant; controlling the multi-stage heater 3 to establish a temperature gradient in an interface where the seed crystal 15 makes contact with the compound melt and the compound melt, and controlling a relationship between the temperatures of the thermocouples to be thermocouple b>thermocouple c>thermocouple e>thermocouple d>thermocouple a, during which the temperature gradient of the solid-liquid interface is ensured to be about 5 k/mm; and conducting VGF crystal growth, so as to obtain a gallium phosphide semiconductor single crystal material.

Carrier concentration of prepared sulfur-doped gallium phosphide crystals: $(1-8) \times 10^{17}$ cm$^{-3}$; mobility: ≥100 cm$^2$ V$^{-1}$ S$^{-1}$; dislocation density <5000/cm$^2$.

Carrier concentration of prepared zinc-doped gallium phosphide crystals: $(5-200) \times 10^{17}$ cm$^{-3}$; mobility: ≥25 cm$^2$ V$^{-1}$ S$^{-1}$; dislocation density <5000/cm$^2$.

In conclusion, it can be seen that according to the method for continuous VGF crystal growth through rotation after horizontal injection synthesis and the matched device for continuous VGF crystal growth through rotation after horizontal injection synthesis provided by the invention, polycrystalline raw materials do not need to be added before VGF crystal growth after injection synthesis, the process is simplified, and the condition that the seed crystal 15 is molten by the pure metal before VGF growth is avoided; and the method has simple steps and is easy to operate and control, the device is simple in structure and easy to operate, and a synthesized semiconductor crystal is controllable in shape and uniform in quality, so the invention is favorable for realizing industrialized production of semiconductor crystals.

The invention claimed is:

1. A device for continuous VGF crystal growth through rotation after horizontal injection synthesis, comprising a furnace body, a synthesis and crystal growth system positioned in a furnace cavity, and a heating system, a temperature measuring system, a heat preservation system and a control system matched therewith, and characterized in that the synthesis and crystal growth system comprises a crucible with a seed crystal containing cavity on a side, and a volatile element carrier arranged on a horizontal side thereof, the volatile element carrier is communicated with the crucible through an injection pipe to realize horizontal injection synthesis, and the furnace body has a rotational freedom degree by means of a matched rotating mechanism, thus realizing vertical temperature gradient crystal growth through rotation after horizontal injection synthesis.

2. The device according to claim 1, characterized in that a tail end of the injection pipe faces away from or inclines away from the volatile element carrier.

3. The device according to claim 2, characterized in that the injection pipe is of a multi-section type, and an end section thereof inclines away from the volatile element carrier and forms an included angle of 60°-85° with the volatile element carrier.

4. The device according to claim 1, characterized in that the synthesis and crystal growth system further comprises a loading frame for loading the crucible and the volatile element carrier, the loading frame is matched with a sealing cover, the sealing cover is provided with an exhaust port, and the loading frame is made of quartz, silicon carbide, boron nitride or ceramic materials.

5. The device according to claim 1, characterized in that the heating system structurally comprises a multi-stage heater sleeved on a periphery of the synthesis and crystal growth system; the heat preservation system structurally comprises a heat preservation sleeve sleeved outside the heating system; and the temperature measuring system structurally comprises thermocouples a, c and/or d and/or e and b which are respectively used for measuring the temperatures of a seed crystal containing cavity region, a synthesis and crystal growth part region and a volatile element carrier region in the crucible.

6. The device according to claim 1, characterized in that the rotating mechanism comprises a driving motor and a reducer connected with an output shaft of the driving motor, an output shaft of the reducer is connected with a furnace body rotating shaft through a coupling, and the furnace body is limited on a bracket through the furnace body rotating shaft.

7. A method for continuous VGF crystal growth through rotation after horizontal injection synthesis, based on a device for continuous VGF crystal growth through rotation after injection synthesis comprising a furnace body, a crystal synthesis and growth system positioned in a furnace cavity, and a heating system, a temperature measuring system, a heat preservation system and a control system matched therewith, and characterized in that the crystal synthesis and growth system comprises a crucible with a seed crystal containing cavity on a side, and a volatile element carrier arranged on a horizontal side of the crucible and communicated with the crucible through an injection pipe, and the furnace body is matched with a rotating mechanism; and the method comprising the following steps:

(I) material preparation and device assembly: loading a volatile element into the volatile element carrier and sealing the volatile element carrier, placing a seed crystal, a metal element and boron oxide in the crucible, and positioning the volatile element carrier and the crucible in the furnace cavity together, wherein a liquid surface of a compound melt formed by the metal element and the volatile element is controlled to be lower than the seed crystal containing cavity, and the compound melt is sealed after the boron oxide is molten with the liquid level higher than the seed crystal containing cavity;

(II) sealing the furnace body and introducing protective gas after vacuumizing;

(III) heating to melt the metal element and the boron oxide;

(IV) heating to enable the volatile element to enter a metal element melt through the injection pipe, and injecting a synthetic compound melt; and (V) after synthesis, rotating the furnace body to a vertical state by means of the rotating mechanism, and adjusting the temperature distribution in a region where the crucible is located, thus realizing continuous VGF crystal growth after synthesis.

8. The method according to claim 7, characterized in that in step (I), the volatile element carrier and the crucible are positioned in the furnace cavity together by firstly extending the injection pipe of the volatile element carrier into the crucible, then placing into a sealed bin provided with an exhaust port together, and then positioning the sealed bin in the furnace cavity.

9. The method according to claim 7, characterized in that a temperature required to melt the metal element and the boron oxide by heating in step (III) is: making a temperature of the metal element higher than a melting point of the compound by 30-70° C., and a temperature of a seed crystal containing chamber region lower than the melting point of the compound by 5-15° C.; when the volatile element enters the metal element melt through the injection pipe by heating in step (IV), a condition for heating the volatile element to reach a temperature is to ensure that a pressure in the volatile element carrier is higher than a dissociation pressure of the compound melt; after synthesis in step (V), the compound melt is firstly cooled to be 5-20° C. higher than the melting point of the compound, an interface temperature between the liquid surface of the compound melt and one side of the seed crystal containing cavity of the crucible is controlled to be 3-5° C. higher than a crystallizing point of the compound, and the temperature of the seed crystal containing cavity region is kept stable; and after the furnace body is rotated to the vertical state in step (V), the compound melt is allowed to stand for 10-30 min.

10. The method according to claim 7, characterized in that a rotation rate in step (V) is controlled to be 20-40°/h; the temperature of the seed crystal containing cavity region is kept stable during rotation; and after rotating to the vertical state, the temperature distribution in a region where the crucible is located is adjusted, and a temperature gradient is established in an interface where the seed crystal makes contact with the compound melt and the compound melt by coordinated control of the temperature measuring system and the control system, so that continuous VGF crystal growth after injection synthesis is realized.

11. The method according to claim 7, characterized in that in the device for continuous VGF crystal growth through rotation after injection synthesis, the rotating mechanism structurally comprises a driving motor and a reducer connected with an output shaft of the driving motor, an output shaft of the reducer is connected with a furnace body rotating shaft through a coupling, and the furnace body is limited on a bracket through the furnace body rotating shaft.

12. The method according to claim 7, characterized in that in the device for continuous VGF crystal growth after injection synthesis, a tail end of the injection pipe faces away from or inclines away from the volatile element carrier and forms an included angle of 60°-85° with the volatile element carrier.

13. The method according to claim 7, characterized in that in the device for continuous VGF crystal growth through rotation after injection synthesis, the heating system structurally comprises a multi-stage heater sleeved on a periphery of the crystal synthesis and growth system; the heat preservation system structurally comprises a heat preservation sleeve sleeved outside the heating system; and the temperature measuring system structurally comprises thermocouples a, c and/or d and/or e and b which are respectively used for measuring the temperatures of a seed crystal containing cavity region, a synthesis and crystal growth part region and a volatile element carrier region in the crystal growth crucible.

* * * * *